United States Patent
Eun

(10) Patent No.: US 7,902,037 B2
(45) Date of Patent: Mar. 8, 2011

(54) ISOLATION STRUCTURE IN MEMORY DEVICE AND METHOD FOR FABRICATING THE SAME

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 108 days.

(21) Appl. No.: 12/329,709

(22) Filed: Dec. 8, 2008

(65) Prior Publication Data

US 2009/0243050 A1  Oct. 1, 2009

(30) Foreign Application Priority Data

Mar. 27, 2008  (KR) ................ 10-2008-0028631

(51) Int. Cl.
*H01L 21/76* (2006.01)

(52) U.S. Cl. .. 438/435; 438/221; 438/296; 257/E21.546; 257/E21.628; 257/E21.642

(58) Field of Classification Search ............... 438/424, 438/435, 218, 221, 294, 296, 427, FOR. 221, 438/FOR. 227; 257/E21.546, E21.628, E21.642
See application file for complete search history.

(56) References Cited

U.S. PATENT DOCUMENTS

| 6,140,208 A * | 10/2000 | Agahi et al. ................ 438/437 |
| 6,995,095 B2 * | 2/2006 | Yu ................ 438/750 |
| 7,169,682 B2 * | 1/2007 | Hirohama et al. ........... 438/424 |
| 2002/0076900 A1 * | 6/2002 | Park et al. ................ 438/424 |
| 2004/0209479 A1 * | 10/2004 | Heo et al. ................ 438/720 |
| 2005/0287731 A1 | 12/2005 | Bian et al. ................ 438/201 |

FOREIGN PATENT DOCUMENTS

| KR | 10-2000-0057890 | 9/2000 |
| KR | 10-2002-0048119 | 6/2002 |
| KR | 10-2002-0072657 A | 9/2002 |
| KR | 10-2006-0077777 | 7/2006 |

* cited by examiner

*Primary Examiner* — Matthew S Smith
*Assistant Examiner* — Quovaunda Jefferson
(74) *Attorney, Agent, or Firm* — Marshall, Gerstein & Borun LLP

(57) ABSTRACT

A method for fabricating an isolation structure in a memory device includes forming a first trench in a cell region of a semiconductor substrate and a second trench in a peripheral region of the semiconductor substrate. The method also includes oxidating the surface of the first and second trenches to form a sidewall oxide layer; depositing a tetraethylorthosilicate(TEOS) layer on the sidewall oxide layer; forming a silicon nitride layer and a silicon oxide layer on the TEOS layer; selectively removing portions of the silicon nitride and silicon oxide layers on the second trench to expose a portion of the underlying TEOS layer; coating a flowable insulation layer that fills the first and second trenches; and curing the flowable insulation layer.

7 Claims, 6 Drawing Sheets

CELL REGION | PERIPHERAL REGION

CELL REGION | PERIPHERAL REGION

CELL REGION | PERIPHERAL REGION

CELL REGION | PERIPHERAL REGION

CELL REGION | PERIPHERAL REGION

CELL REGION | PERIPHERAL REGION

CELL REGION | PERIPHERAL REGION

ISOLATION STRUCTURE IN MEMORY DEVICE AND METHOD FOR FABRICATING THE SAME

CROSS-REFERENCE TO RELATED APPLICATION

The priority of Korean patent application No. 10-2008-0028631 filed on Mar. 27, 2008, which is incorporated by reference in its entirety, is claimed.

BACKGROUND OF THE INVENTION

1. Field of the Disclosure

The invention generally relates to a semiconductor device and, more particularly, to an isolation structure in a memory device and a method for fabricating the same.

2. Brief Description of Related Technology

As an integration degree of semiconductor memory devices is raised, a design rule of circuit patterns is also rapidly reduced. For example, as a design rule of a Dynamic Random Access Memory (DRAM) device is reduced to less than 50 nm, finer patterns must be formed. With the reduction in a design rule, a superior gap filling property is required in a process of forming an isolation structure. Since an aspect ratio of the trench is sharply increased and the width of the trench is more decreased when the isolation structure is realized in a Shallow Trench Isolation (STI) method, it is required that an insulation material for filling the trench has higher gap filling properties.

As the design rule is rapidly reduced to less than 50 nm, a process of filling the trench by high density plasma (HDP) deposition represents a limitation. Therefore, a method of filling the trench using flowable dielectric that represents higher gap filling properties as compared to HDP oxide has been tried. In this method using the flowable dielectric, the isolation layer is formed to fill the trench by coating an insulation material source in liquid or suspension form, filling the trench using flowability of the liquid source and then curing the coated layer. This coating process can be performed using a spin coater. The insulation layer by this process can be appreciated as a Spin On Dielectric (SOD).

However, when forming the isolation layer using this flowable insulator, deterioration of punchthrough properties in PMOS transistors is observed. The PMOS transistor is mainly formed in a peripheral region of the DRAM device and Hot Electron Induced Punchthrough (HEIP) properties of the PMOS transistor represent rapid deterioration. This is a result of a nitride liner introduced in an interface between the flowable insulation layer and side wall and bottom of the trench.

FIGS. 1 and 2 illustrate the HEIP of a PMOS transistor.

Referring to FIG. 1, an isolation layer 20 that defines an active region 10 in a semiconductor substrate may be formed in a STI structure. At this time, an operation of a gate 30 of the PMOS transistor formed on the active region 10 is affected by effective channel width in the active region 10. This effective channel width depends on the width of the active region 10, but is also affected by distribution of charges trapped in the interface between the active region and the isolation layer 20.

For example, as the design rule rapidly decreases, an electric field between the channels increases, and a relatively large number of hot electrons are generated. These hot electrons (e) penetrate into the isolation layer 20 and are trapped in the interface at the isolation layer 20 side, and P-type carriers such as a hole (+) are trapped in the interface at the opposite active region 10 side by the trapped electrons (e). These P-type carriers actually induce an effect of reducing the effective channel width of the PMOS transistor. By this reduction in the channel width, a threshold voltage (Vt) of the PMOS transistor is rapidly reduced, and off-leakage current is rapidly increased.

Referring to FIG. 2, a triple liner structure of a first silicon oxide layer 21, a silicon nitride layer 23, and a second silicon oxide layer 25 for the improvement of interface properties is introduced between the active region 10 and the isolation layer 20. When considering a potential well according to the liner structure, it can be appreciated that the hot electrons (e) can be trapped in the silicon nitride layer 23. Actually, the hot electrons (e) are trapped in a trap site that is present in the silicon nitride layer 23 and deteriorate the HEIP properties of the PMOS transistor.

This deterioration of the HEIP properties of the PMOS transistor may become more serious when forming the isolation layer 20 with the flowable insulation layer. When forming the flowable insulation layer, extreme stress may be caused between the isolation layer and the liner of the silicon nitride 23 therebelow in the process of curing the liquid insulation material source after coating it. The stress may be caused from contraction of the insulation layer that occurs when curing the flowable insulation layer. This stress causes an effect that increases the electron trap sites in the silicon nitride layer 23, and this may result in the trap of more hot electrons (e) in the interface of the isolation layer 20 as shown in FIG. 1. Therefore, the HEIP properties of the PMOS transistor are deteriorated more seriously.

SUMMARY OF THE INVENTION

In one embodiment, a method for fabricating an isolation structure in a memory device includes: forming a first trench in a cell region of a semiconductor substrate and a second trench in a peripheral region of the semiconductor substrate; oxidating the surface of the first and second trenches to form a sidewall oxide layer; depositing a TEOS layer on the sidewall oxide layer; forming a silicon nitride layer and a silicon oxide layer on the TEOS layer; selectively removing portions of the silicon nitride and silicon oxide layers on the second trench to expose a portion of the underlying TEOS layer; coating a flowable insulation layer that fills the first and second trenches; and curing the flowable insulation layer.

The first trench may be formed so as to define a first active region of the semiconductor substrate to be formed with a channel of a NMOS transistor, and the second trench may have a width wider than that of the first trench and be formed so as to define a second active region of the semiconductor substrate to be formed with a channel of a PMOS transistor.

The deposited TEOS layer preferably has a thickness equal to that of the sidewall oxide layer.

The deposited TEOS layer preferably has a thickness of 40 Å.

The step of selectively removing the silicon nitride and silicon oxide layers includes covering a portion of the silicon oxide layer on the first trench with a mask; dry etching the portion of the silicon oxide layer, which is on the second trench and is exposed by the mask, with a fluorocarbon based etchant gas; and stopping the dry etching after the TEOS layer is exposed.

The dry etching may include supplying tetrafluorocarbon ($CF_4$) gas and argon gas (Ar); and plasma-exciting the tetrafluorocarbon gas and the argon gas.

The coating step may include coating a polysilazane based SOD to form the flowable insulation layer.

The layer of the coated polysilazane may be annealed under an atmosphere including hydrogen gas and oxygen gas in the curing step.

In another embodiment, an isolation structure in a memory device includes: a semiconductor substrate including a first trench formed in a cell region, the first trench defining a first active region to be formed with a channel of a NMOS transistor, and a second trench formed in a peripheral region, the second trench defining a second active region to be formed with a channel of a PMOS transistor; a first liner layer on a surface of the first trench, the first liner layer including a sidewall oxide layer, a TEOS layer, a silicon nitride layer and a silicon oxide layer; a second liner layer on a surface of the second trench, the second liner layer including a sidewall oxide layer and a TEOS layer; and a flowable insulation layer filling the first and second trenches.

The flowable insulation layer may include a polysilazane based SOD.

The embodiments of the present invention can provide an isolation structure in a memory device that can inhibit deterioration of HEIP properties of a PMOS transistor when forming a STI structure using a flowable insulation layer, and a method for fabricating the same.

Additional features of the invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1:
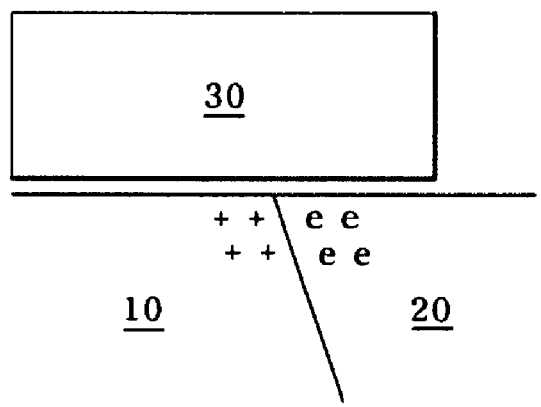
FIGS. 1 and 2 schematically illustrate HEIP of a PMOS transistor.
Figure 2:
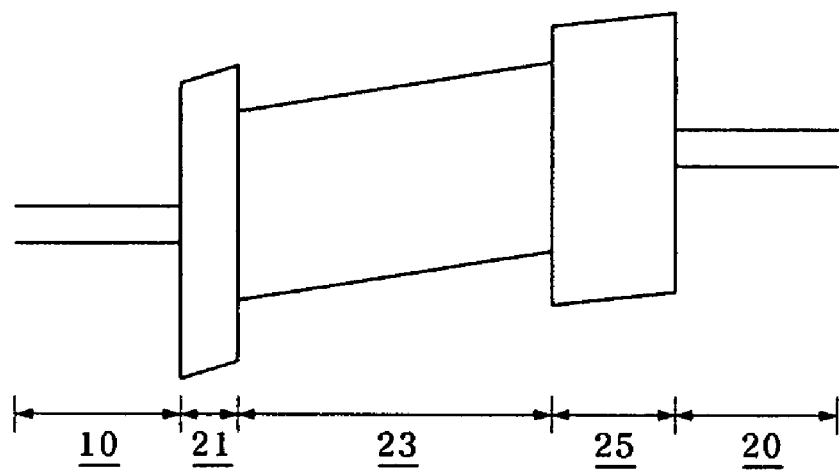

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DESCRIPTION OF SPECIFIC EMBODIMENTS

In the present embodiments, isolation structures having different structures from each other are introduced in a cell region in which memory cells including NMOS transistors are disposed and a peripheral region in which PMOS transistors and NMOS transistors are disposed together. The isolation structure in the cell region introduces a liner structure of a silicon nitride layer in an interface between a first trench and a first isolation layer, but the isolation structure in the peripheral region excludes the liner structure of a silicon nitride layer in an interface between a second trench and a second isolation layer. The liner structure of a silicon nitride layer is substituted by a liner structure of a silicon oxide layer. Therefore, generation of trap sites in the interface between the second trench and the second isolation layer is inhibited, thereby inhibiting deterioration of HEIP properties of PMOS transistor.

In PMOS transistors, the liner structure of a silicon nitride layer may act as a factor that induces the deterioration of HEIP properties. However, in NMOS transistors in the cell region, the liner structure of a silicon nitride layer can act to improve refresh properties of a NMOS transistor that constructs memory cells of a DRAM. The silicon nitride layer can act to inhibit penetration of an oxidation source into the interface of the isolation layer in a subsequent process of forming a gate oxide layer after the forming the STI isolation layer, or in a process of a screen oxide layer accompanied upon ion implantation. This penetration of the oxidation source into the interface of the isolation layer may result in undesirable excessive oxidation in the interface of the isolation layer and may lift the side wall of the isolation layer or result in generation of excessive stress in the interface between the isolation layer and the active region.

This deterioration of interface properties may increase current leakage in cell transistors. The silicon nitride layer inhibits penetration of this oxidation source and thus can inhibit current leakage in cell transistors. In the embodiments of the present invention, an effect of inhibiting current leakage in the cell transistor is realized by introducing a liner structure of a silicon nitride layer in an interface between the first isolation layer in the cell region and the first trench. Therefore, it is possible to improve operation refresh properties of a DRAM device and thus reduce a refresh time.

On the contrary, the liner structure actually constituted of silicon oxide layers is introduced in the interface between the second trench and the second isolation layer of the peripheral region to resultantly exclude the silicon nitride layer that acts as an electron trap site. Therefore, it is possible to inhibit a phenomenon that hot electrons are trapped in the interface between the second trench and the second isolation layer and thus an effective channel width of a PMOS transistor is reduced, i.e. deterioration of HEIP properties.

Meanwhile, in a case of a DRAM, as the design rule is decreased to less than 50 nm, the first trench for the isolation of the cell region has significantly narrow width. In order to fill the first trenches with this narrow width, the isolation layer is formed with a flowable insulation layer having relatively superior gap filling properties, e.g. a SOD layer. A SOD is coated and cured to fill the first and second trenches. At this time, unlike a Spin On Glass (SOG) layer such as a conventional Hydrogen Silsesquioxane (HSQ), a polysilazane based SOD that has relatively low curing temperature and relatively inhibited generation of internal voids upon curing is used. In the case of the SOG, due to excessive contraction and generation of internal voids upon curing, it is difficult to realize an isolation structure with fine line width actually required in the semiconductor device of 50 nm technology and below. In the embodiments of the present invention, the first trench in the cell region and the second trench in the peripheral are filled with SOD, thereby realizing an isolation structure with fine line width required in the semiconductor device of 50 nm technology and below.

However, when filling the first and second trenches with the polysilazane based SOD layer as described above, it can be found that silicon slip is generated during an annealing at 350 to 850° C. employed in the process of curing the SOD layer.

Figure 3:
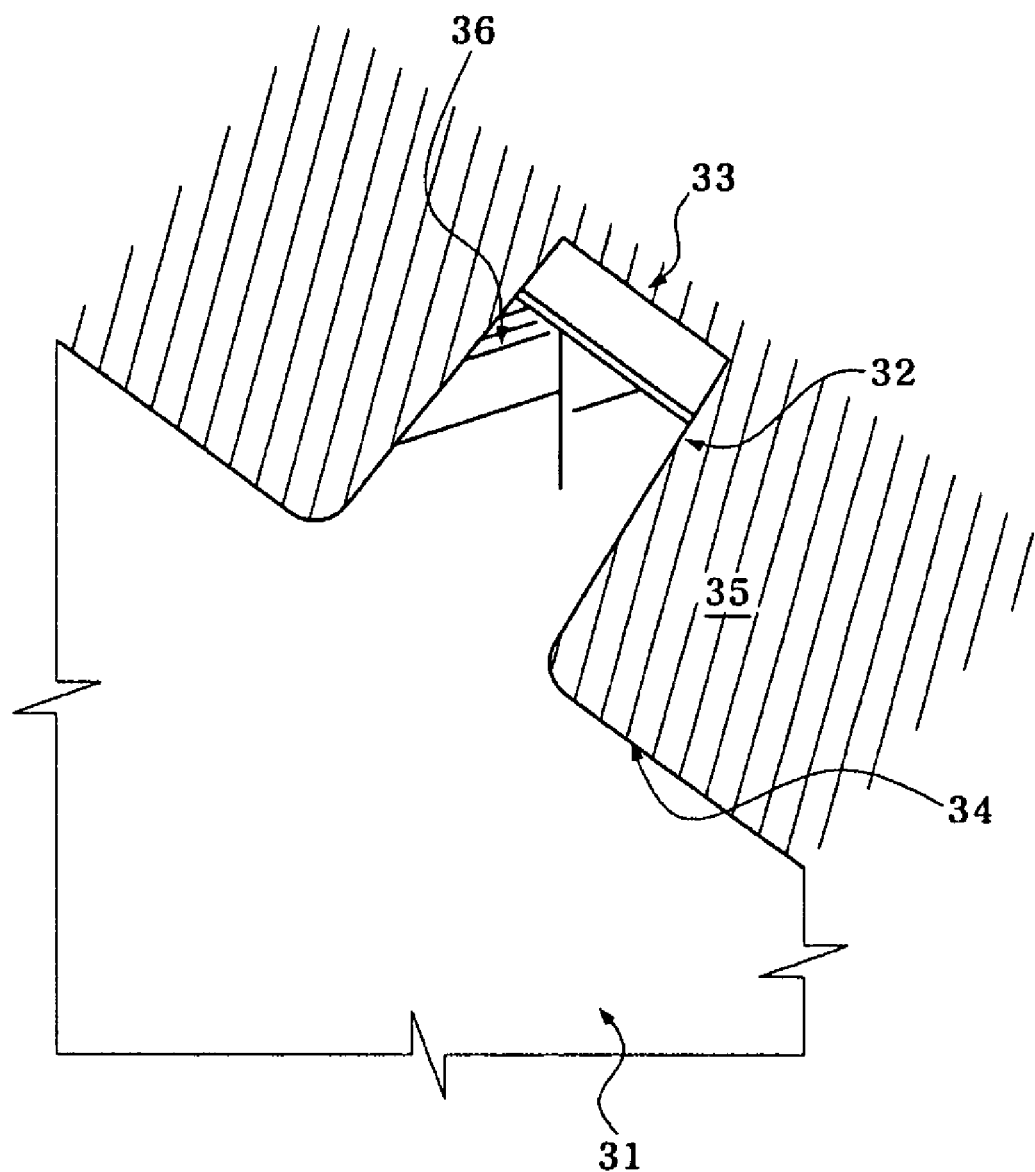
FIGS. 3 and 4 illustrate stress relieving action of a TEOS layer according to an embodiment of the present invention.

FIG. 3 illustrates the silicon slip phenomenon resulted from the formation of the polysilazane based SOD layer. Referring to FIG. 3, a pad layer 33 of silicon nitride and oxide that covers an active region 32 in a peripheral region is formed on the silicon substrate 31. The portion of the silicon substrate 31 exposed by the pad layer 33 is selectively etched to form a trench 34. At this time, the trench 34 is formed so as to define the active region 32 on which a channel of a PMOS transistor to be formed in the peripheral region will be formed. Therefore, the trench is formed with wider line width as compared to a cell trench formed so as to define a cell active region on which a channel of a NMOS transistor of a cell region will be formed.

A polysilazane based chemical liquid is coated and cured to fill the trench 34, thereby forming an isolation layer 35. At this time, a liner of a silicon nitride layer in an interface between the trench 34 and the isolation layer 35 is selectively removed. It is possible to inhibit deterioration of HEIP properties of the PMOS transistor in the peripheral region by maintaining the liner of a silicon nitride layer in the cell trench formed in the cell region but selectively removing the liner of a silicon nitride layer from the trench 34 in the peripheral region.

However, when the liner of a silicon nitride layer from the trench 34, the polysilazane SOD forming the isolation layer 35 contracts during the curing process and, thus, compressive stress is applied to the active region 32 adjoining to the isolation layer 35. This compressive stress results in generation of a dislocation 36 in a silicon crystal structure in the active region 32 and this generation of the dislocation 36 results in a slip phenomenon in a direction of a surface of the silicon crystal. This slip phenomenon due to the dislocation 36 results in large obstacle in an action of the active region 32 as a channel of a transistor.

This generation of the dislocation 36 or the slip phenomenon is understood to occur as a result of the removal of the liner of a silicon nitride layer in the interface between the trench 34 and the isolation layer 35. The liner of a silicon nitride layer is measured to represent tensile stress upon annealing. Therefore, when the liner of a silicon nitride layer is introduced, the tensile stress induced by the liner of a silicon nitride layer compensates the compressive stress by the contraction of the SOD layer. Accordingly, the dislocation 36 or the slip phenomenon of the silicon can be inhibited, but in the embodiments of the present invention, it is difficult to expect this stress compensation effect since the liner of the silicon nitride layer is removed from the trench 34 in the peripheral region, particularly from the trench 34 that defines the active region 32 of the PMOS transistor. Therefore, in order to inhibit the generation of the silicon dislocation 36 by compensating the compressive stress of the SOD layer, the embodiments of the present invention introduces a liner layer capable of providing tensile stress upon annealing in the interface between the trench 34 and the isolation layer 35.

Figure 4:
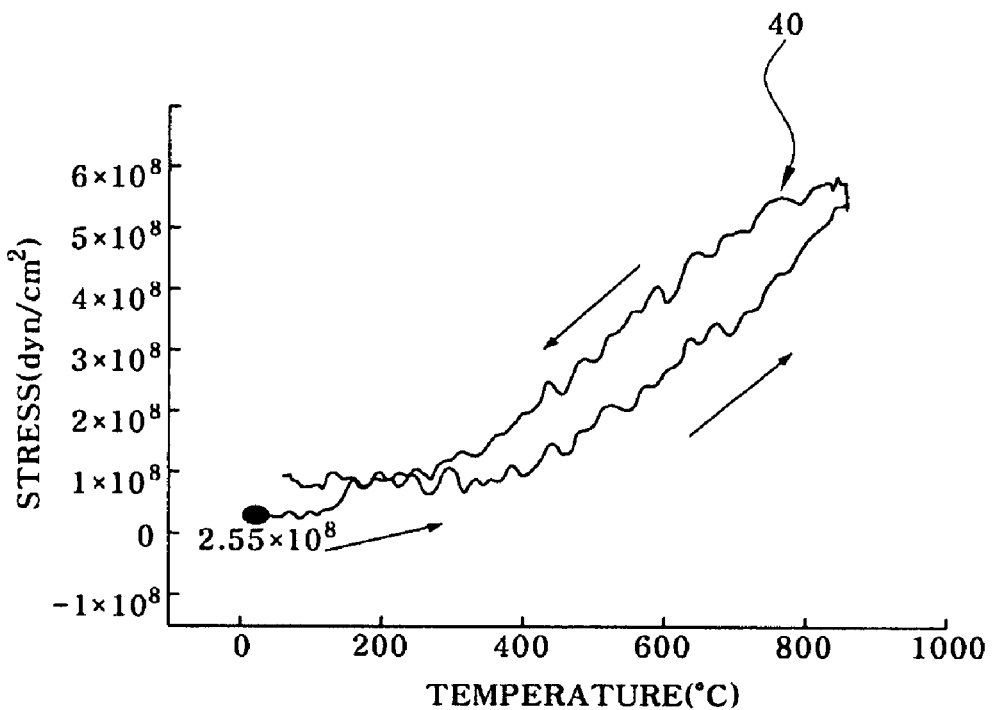

The liner layer introduced to provide the tensile stress for the compensation of the compressive stress may include a Tetra Ethyl Ortho Silicate (TEOS) oxide layer. The TEOS layer may be formed of Low Pressure TEOS (LP-TEOS) formed in a deposition process that is performed at a low pressure. The LP-TEOS layer is measured to show the hysteresis 40 as shown in FIG. 4 upon annealing. When considering the hysteresis 40 in FIG. 4, it is confirmed that the LP-TEOS layer represents the tensile stress as the annealing temperature is increased. This tensile stress compensates the compressive stress according to the annealing of the isolation layer (35 in FIG. 3) of the SOD layer to inhibit that the compressive stress is actually applied to the active region 32. Therefore, generation of the dislocation can be inhibited and the silicon slip phenomenon can be also inhibited.

FIGS. 5 to 11 illustrate an isolation structure in a memory device and a method for forming the same according to an embodiment of the present invention.

Figure 5:
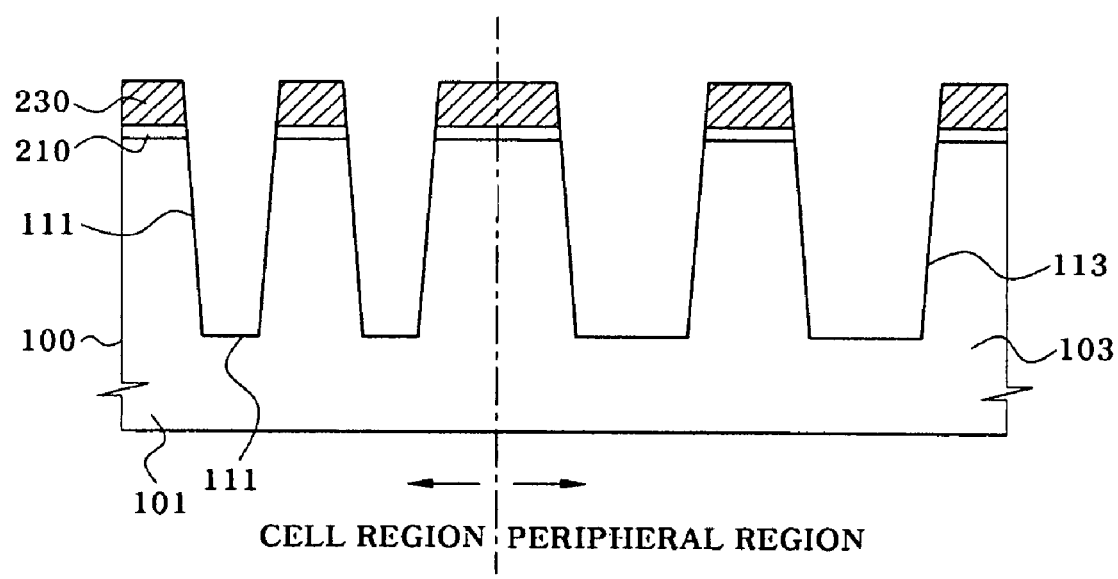
FIGS. 5 to 11 schematically illustrate an isolation structure in a memory device and a method for fabricating the same according to an embodiment of the present invention.

Referring to FIG. 5, trenches 111, 113 for STI structure are formed in a semiconductor substrate 100 including a cell region on which NMOS transistors are formed as cell transistors and a peripheral region on which PMOS transistors are disposed. At this time, the semiconductor substrate 100 may be made of a silicon single crystalline substrate. In order to form the trenches 111, 113, first, an oxide layer pad 210 and a nitride layer pad 230 for covering an active region are sequentially formed on the semiconductor substrate 100. After that, a portion of the semiconductor substrate 100 exposed in the nitride layer pad 230 is selectively etched, thereby forming the trenches 111, 113.

At this time, the trenches 111, 113 may be formed to a depth of 1600 to 1800 Å. The first trench 111 in the cell region is formed so as to have narrow width as compared to the second trench 113 in the peripheral region. As the design rule of semiconductor devices such as DRAM memory devices is decreased to less than 50 nm, the line width in the active region in the cell region 101 is greatly narrowed and the width of the first trench 111 that defines the active region is also narrowed. In order to fill the narrow gap of the first trench 111 without generation of nano-voids of nanometer level, a flowable insulation layer such as a polysilazane based SOD is introduced. Before forming an isolation layer that fills the trenches 111, 113, a liner layer is deposited in the trenches 111, 113 to induce improvement in interface properties.

Figure 6:
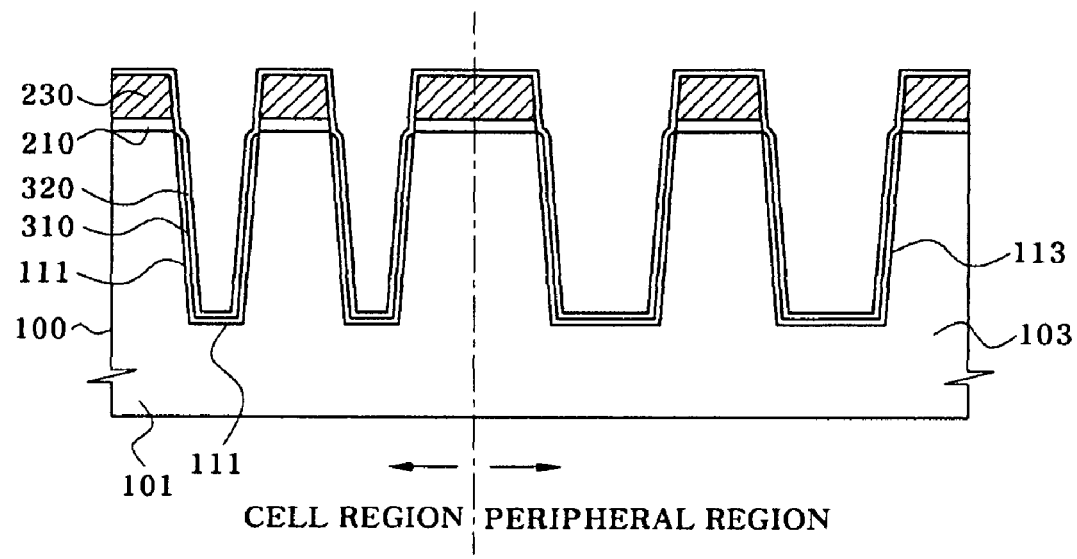

Referring to FIG. 6, oxidation is performed on the semiconductor substrate 100 to form a first oxide layer 310 on the exposed surface of the trenches 111, 113 with wall oxide layer. The first oxide layer 310 is formed by thermal oxidation and can compensate surface damage generated in the process of forming the trenches 111, 113. Also, it can relieve the stress present in an interface between the silicon nitride layer 330 to be subsequently deposited, and the trenches 111, 113. This first oxide layer 310 is formed to a thickness of 35 to 45 Å, preferably about 40 Å by a dry oxidation process. This thickness of the first oxide layer 310 is half of the thickness, which is about 80 Å, of the case that the LP-TEOS layer is not introduced unlike an embodiment of the present invention.

A TEOS layer 320 is deposited on the first oxide layer 310. The TEOS layer 320 may be formed in a furnace by a low pressure deposition process. In other words, the TEOS layer 320 may be formed in a LP-TEOS deposition process. For example, into a deposition chamber maintained at a lower pressure of about 0.4 Torr, the semiconductor substrate 100 is mounted, oxygen ($O_2$) gas is provided as an oxidant, nitrogen ($N_2$) gas is provided as an atmosphere gas, and TEOS gas is provided. At this time, the supply ratio of the nitrogen gas, the oxygen gas and the TEOS gas may be set to about 50 cc/20 cc/290 cc. By performing the process of depositing the TEOS layer 320 as described above, the TEOS layer 320 having a thickness of 35 to 45 Å, preferably about 40 Å is formed.

Figure 7:
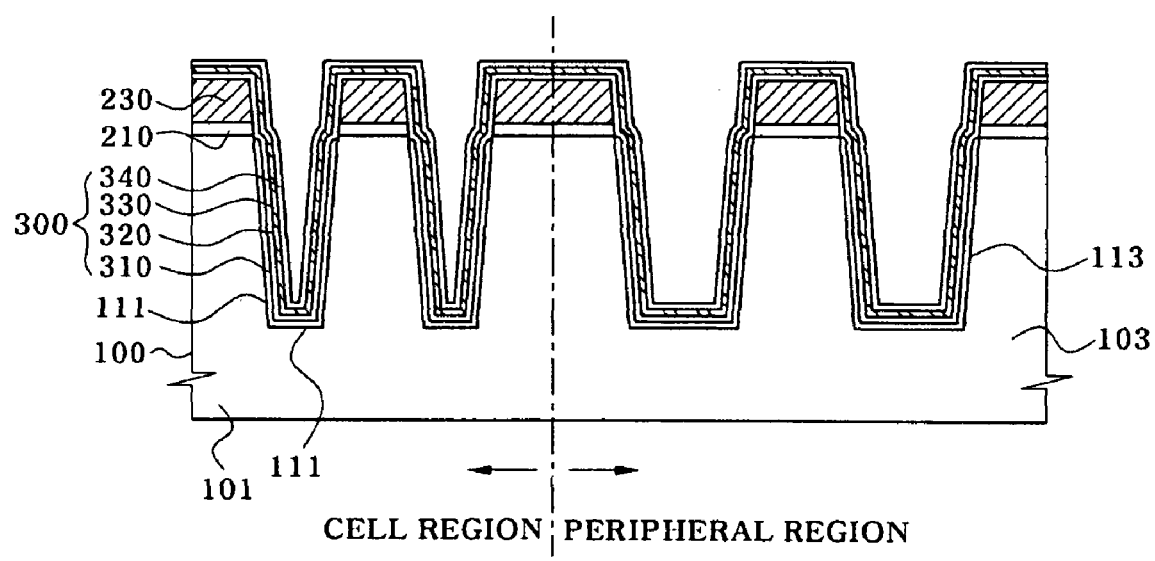

Referring to FIG. 7, a silicon nitride layer 330 is deposited on the TEOS layer 320 as a liner. At this time, the silicon nitride layer 330 may be deposited to a thickness of 70 to 75 Å. This liner silicon nitride layer 330 can inhibit penetration of an oxidant source introduced in semiconductor fabrication process performed after forming the STI, for example, an oxidation process or a thermal oxidation process such as forming a screen oxide layer accompanied upon ion implantation for threshold voltage control or a subsequent oxidation process for forming a gate dielectric layer. This penetration of the oxidant source results in an oxide layer having excessive thickness in the interface between the active region and the isolation layer and, thus, may act as a factor that results in excessive leakage current. As such, the silicon nitride layer 330 reduces deterioration of isolation properties in subsequent processes and, thus, can inhibit a junction leakage. Therefore, it is effective to reduce the refresh time of NMOS transistors in a cell of the DRAM device.

On the silicon nitride layer 330, a second oxide layer 340 is deposited with a liner of silicon oxide. The second oxide layer 340 is introduced to relieve an interface stress between the isolation layer that actually fills the trenches 111, 113 and the silicon nitride layer 330.

Through these processes, a first liner layer 300 that covers exposed side wall and bottom surface of the trenches 111, 113 is formed. The first liner layer 300 may be formed of a multi-layer in which different kinds of insulation layers are stacked, for example, a multi-layer including a first oxide layer 310 of the wall oxide, the TEOS layer 320, the silicon nitride layer 330, the second oxide layer 340 or deposition of a silicon oxide.

Figure 8:
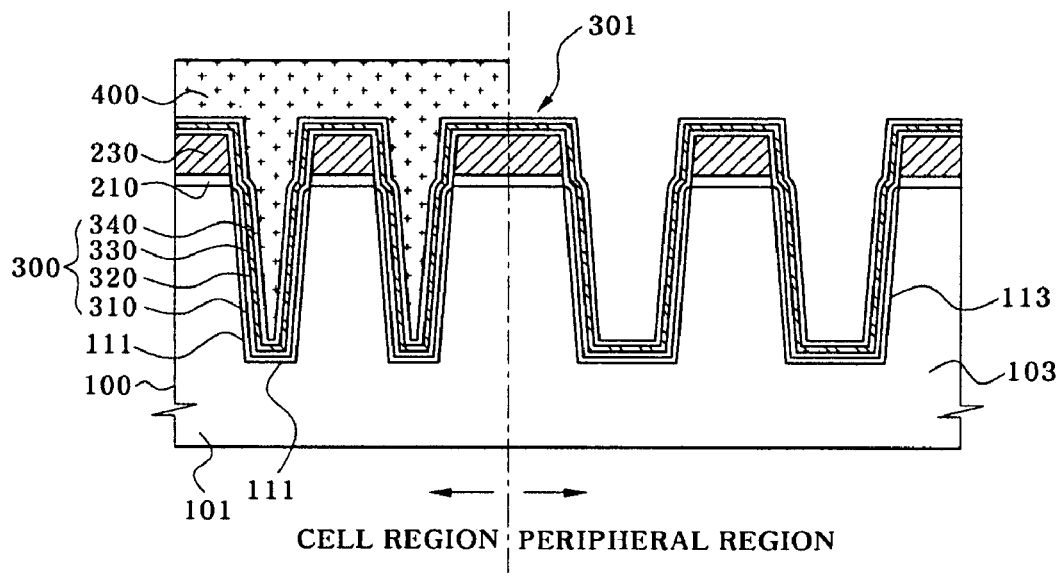

Referring to FIG. 8, a mask 400 for exposing the portion 301 of the first liner layer 300 on the second trench 113 is formed. The mask 400 covers the first trench 111 on the cell region 101 and exposes the peripheral region 103. At this time, the mask 400 may be a photoresist pattern formed through photolithography and development processes.

Figure 9:
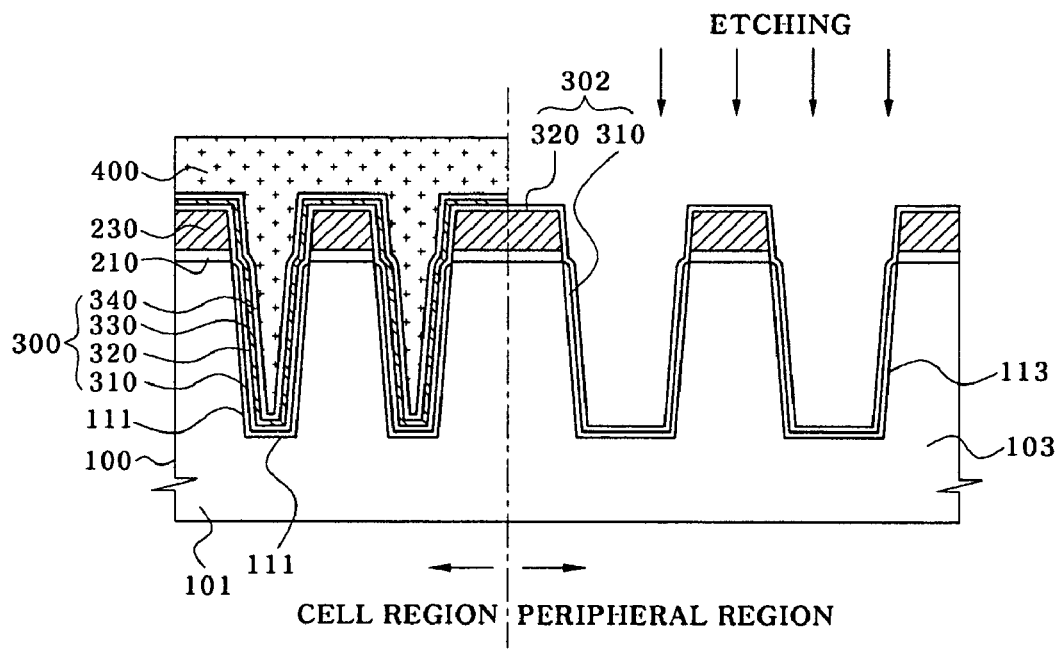

Referring to FIG. 9, a dry etching process is performed on the semiconductor substrate 100 on which a photoresist pattern is formed with the mask 400 to selectively etch the exposed portion 301 of the first liner layer 301. By this etching process, the exposed portion of the silicon nitride layer 330 and the exposed portion of the second oxide layer 340 are selectively etched and removed. Therefore, the TEOS layer 320 below the silicon nitride layer 330 is exposed, and thus a second liner layer 302 structure including the TEOS layer 320 and the first oxide portion 310 of the wall oxide therebelow is realized.

The etching process may be performed in a dry etching process using fluorocarbon ($CF_x$) based gas as an etchant. For example, the semiconductor substrate 100 is mounted into the etching chamber, the pressure in the chamber is maintained at about 20 mTorr and then tetrafluorocarbon ($CF_4$) gas is provided at about 80 sccm. At this time, argon (Ar) gas is provided together at 50 sccm. The dry etching can be performed by applying Radio Frequency power of about 500 W as a plasma generation power to excite the gases to the plasma state, and applying a back bias of about 200 W to the rear surface of the semiconductor substrate 100.

Figure 10:
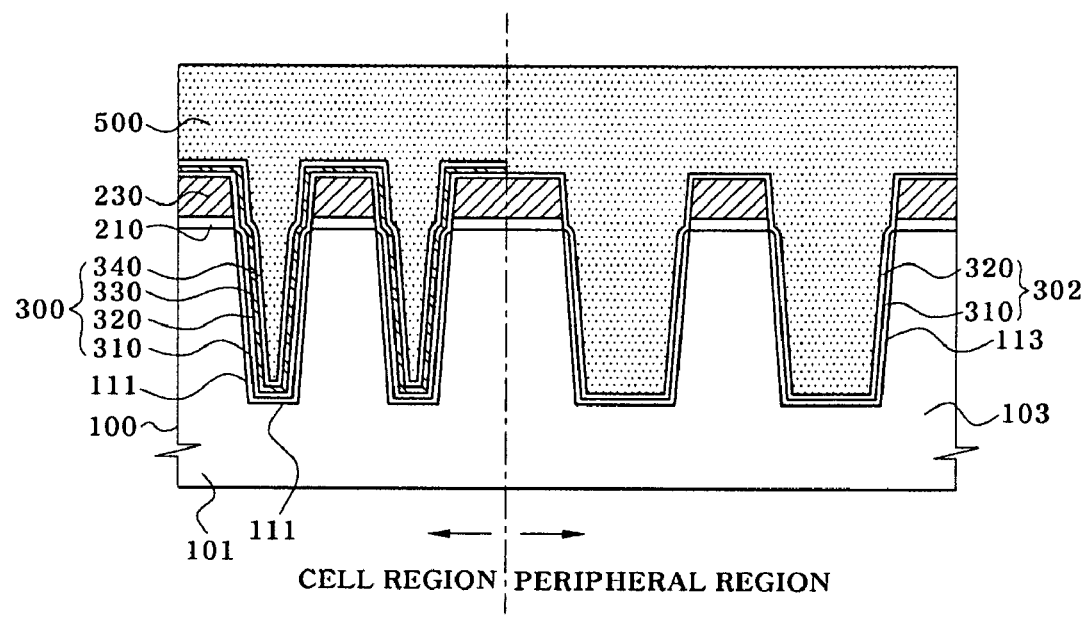
Figure 11:
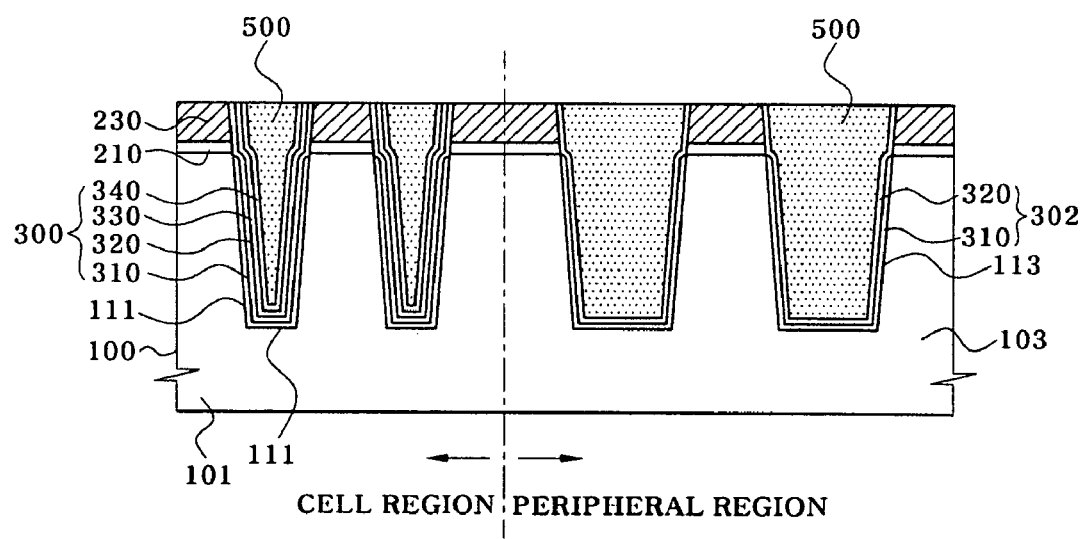

Referring to FIG. 10, an isolation layer 500 for filling the first and second trenches 111, 113 is formed. The isolation layer 500 is formed of a flowable insulation layer such as a SOD so as to sufficiently fill the first trench 111 having actually relatively narrow line width. Since the first trench 111 is formed so as to define the active region in the cell region in the DRAM device, the isolation layer 500 is formed for the isolation of the NMOS transistors in the cell in the DRAM device.

The isolation layer 500 is actually formed using a polysilazane based SOD that can fill the first and second trenches 111, 113 having narrow line width required in a semiconductor device of 50 nm technology and below. The semiconductor substrate 100 is mounted on a spin chuck of a spin coater, and the liquid polysilazane is coated on the semiconductor substrate 100 while rotating the spin chuck. Since the polysilazane is in liquid phase and has flowability, the polysilazane is coated while filling the first trench 111 by the rotation coating. At this time, the second trench 113 having relatively wide line width is also filled with the polysilazane.

Solvent of the coated polysilazane solution is volatilized and then the coated polysilazane solution is cured. Therefore, the isolation layer 500 is actually formed of an insulation layer of a silicon oxide ($SiO_2$) structure. The curing process of this polysilazane SDO layer may be performed by annealing with a reaction atmosphere including hydrogen gas ($H_2$) and oxygen gas ($O_2$). At this time, the supply ratio of the hydrogen gas and the oxygen gas may be set to 1:1 in a ratio of flow rate. At this time, the annealing may be performed at a temperature of about 850° C. for about one hour. In this curing process, the high molecular polysilazane reacts with the hydrogen and the oxygen to produce the silicon oxide layer.

This polysilazane based SOD layer is estimated as a flowable insulation layer that overcomes the problems resulting from the SOG layer using HSQ based chemical. The HSQ results in excessive stress in the active region by excessive compression upon curing, which results in undesirable deformation, and results in internal voids. Therefore, the HSQ is difficult to employ in the isolation structure of a semiconductor device of 50 mm design rule or below. The polysilazane based SOD layer solves the problem according to the internal voids or excessive compression and is effective to realize more stable isolation structure.

In addition, since the TEOS layer 320 is maintained even on the second trench 113 from which the silicon nitride layer 330 is removed, the compressive stress according to the contraction of the SOD layer upon annealing can be relieved and compensated by the tensile stress of the TEOS layer. Therefore, the silicon dislocation 36 and resultant silicon slip phenomenon as shown in FIG. 3 can be effectively inhibited.

After forming the first isolation layer 410 that fills the first and second trenches 111, 113, the isolation layer 500, the SOD layer is planarized to individualize the isolation layer 500 into patterns filling the individual trenches 111, 113 respectively. This planarization is performed using Chemical Mechanical Polishing (CMP) in such a process that the SOD layer is polished to expose the surface of the silicon nitride layer 330 in the first liner layer 300 therebelow.

In an embodiment of the present invention, as the design rule of a DRAM device is decreased to less than 50 nm, the gap filling is performed using SOD having relatively superior gap filling properties to fill the first trench for the isolation in the cell region and the second trench in the peripheral region. At this time, a liner nitride layer in the peripheral region having an electrical trouble such as HEIP of PMOS transistors is removed by dry etching. In order to inhibit generation of excessive compressive stress according to removal of the silicon nitride layer, the TEOS layer that induces a tensile stress upon annealing of the SOD is introduced. Therefore, although the silicon nitride layer is removed from the second trench in the peripheral region, it is possible to inhibit generation of the silicon slip phenomenon upon annealing of the SOD. As described above, it is possible to realize more stable isolation properties and inhibit deterioration of properties of PMOS transistor by suggesting the semiconductor device having isolation structures having different structures from each other.

While the present invention has been described with respect to the specific embodiments, it will be apparent to those skilled in the art that various changes and modifications may be made without departing from the spirit and scope of the invention as defined in the following claims.

What is claimed is:

1. A method for fabricating an isolation structure in a memory device, the method comprising:
   forming a first trench in a cell region of a silicon substrate and a second trench in a peripheral region of the silicon substrate;
   oxidating the surface of the first and second trenches to form a sidewall oxide layer;
   depositing a tetraethylorthosilicate(TEOS)layer on the sidewall oxide layer;

forming a silicon nitride layer and a silicon oxide layer on the TEOS layer;

selectively removing portions of the silicon nitride layer and the silicon oxide layer on the second trench to expose a portion of the underlying TEOS layer;

coating a polysilazane-based spin-on-dielectric (SOD) to form a single insulation layer filling the first and second trenches;

and curing the SOD by annealing to a temperature of 850° C., wherein the TEOS layer provides a tensile stress to compensate a compressive stress induced by a contraction of the SOD during the curing and prevent a silicon slip in the silicon substrate resulted from the compressive stress.

2. The method of claim 1, wherein the first trench defines a first active region of the silicon substrate to be formed with a channel of a NMOS transistor, and the second trench has a width wider than that of the first trench, and defines a second active region of the silicon substrate to be formed with a channel of a PMOS transistor.

3. The method of claim 1, wherein the deposited TEOS layer has a thickness equal to that of the sidewall oxide layer.

4. The method of claim 1, wherein the deposited TEOS layer has a thickness of 40 Å.

5. The method of claim 1, wherein the step of selectively removing the silicon nitride and silicon oxide layers comprises:

covering a portion of the silicon oxide layer on the first trench with a mask;

dry etching the portion of the silicon oxide layer, which is on the second trench and is exposed by the mask, with a fluorocarbon based etchant gas; and stopping the dry etching after the TEOS layer is exposed.

6. The method of claim 5, wherein dry etching comprises:

supplying tetrafluorocarbon ($CF_4$) gas and argon gas (Ar); and plasma-exciting the tetrafluorocarbon gas and the argon gas.

7. The method of claim 1, wherein the layer of the coated polysilazane is annealed under an atmosphere comprising hydrogen gas and oxygen gas in the curing step.

* * * * *